United States Patent [19]

Heyraud

[11] Patent Number: 4,982,085
[45] Date of Patent: Jan. 1, 1991

[54] INCREMENTAL OPTICAL ENCODER WITH RADIATION REGULATION MEANS

[75] Inventor: Marc Heyraud, La Chaux de Fonds, Switzerland

[73] Assignee: La Chaux de Fonds, La Chaus de Fonds, Switzerland

[21] Appl. No.: 409,564

[22] Filed: Sep. 19, 1989

[30] Foreign Application Priority Data

Sep. 20, 1988 [CH] Switzerland ............... 03499/88

[51] Int. Cl.⁵ .................... H01J 3/14; G01D 5/34
[52] U.S. Cl. ........................ 250/231.16; 250/237 R
[58] Field of Search ........... 250/231 S, 231 E, 237 G, 250/229, 205, 232, 237 R, 231.16, 231.14, 231.13, 231.17, 231.18; 356/373, 375; 33/706–707; 341/13

[56] References Cited

U.S. PATENT DOCUMENTS

| | | | |
|---|---|---|---|
| 2,506,599 | 5/1950 | Jordan | 250/229 |
| 3,068,746 | 12/1962 | Vawter | 250/232 |
| 3,100,846 | 8/1963 | Burkhardt | 250/229 |
| 3,365,714 | 1/1968 | Timares et al. | 250/229 |
| 3,400,275 | 9/1968 | Trump | 250/231 SE |
| 4,074,128 | 2/1978 | Harris, Jr. et al. | 250/231 SE |
| 4,172,994 | 10/1979 | Bergkvist | 250/237 G |
| 4,511,798 | 4/1985 | Killingsworth | 250/231 SE |
| 4,593,194 | 6/1986 | Graham et al. | 250/231 SE |
| 4,654,525 | 3/1987 | Ebina et al. | 250/231 SE |

Primary Examiner—David C. Nelms
Assistant Examiner—Michael Messinger
Attorney, Agent, or Firm—Fleit, Jacobson, Cohn, Price, Holman & Stern

[57] ABSTRACT

An incremental optical encoder comprising a luminous source 1, an encoder disk 4 having windows 5 and a sensor 3 with at least two photosensitive elements. The light intensity from the source may be varied by use of a U-shaped wire 8 having a branch 12 positioned between the luminous source at the photosensitive elements.

6 Claims, 2 Drawing Sheets

INCREMENTAL OPTICAL ENCODER WITH RADIATION REGULATION MEANS

BACKGROUND AND FIELD OF THE INVENTION

The present invention relates to an incremental optical encoder.

The principles of optical incremental encoders are well known. In summary, a thin disc is provided with a multiplicity of slits around its peripheral edge. The number of slits and their spacing determines the degree of control which can be exercised on the motor upon which the encoder is mounted.

On one axial side of the disc is mounted a light emitting diode which is made to send a beam of light perpendicular to the face of the disc. When this light beam is opposite a slit in the disc the light passes through to land on a light sensitive sensor which changes logical state from zero to one. As the disc rotates so the slit moves on and the light beam is cut off by the disc material between the slits. The light sensor returns to logic level zero.

It is common to provide two light emitting diodes and two light sensitive elements each side by side on opposite sides of the disc. By precise placing of the two sets of electronic devices they can be made to give up/down signals 90 degrees out of phase with one another. Because of this it is possible to use the two signal channels to determine the direction of rotation of the motor. This is essential for full servo control. Since both the up edges and the down edges of each signal can be used then there are four signals for each disc slit. This further enhances servo control.

One problem faced by designers of these encoders is concerned with the fact that the light emitting diodes propogate a dispersant beam. Some degree of masking can reduce this. However the fact that the disc can move axially between the emitters and receivers can cause a dispersed beam to reach a sensor. The consequence of this is that the time when the sensor is at logic level zero and the time at logic level one are not equal. This is often called the signal duty cycle. If these duty cycles are allowed to vary substantially then the states of both sensors cannot be compared to sense direction any more since one of the signals, having a short up time may go down before the other sensor which may have a long up time hence spoiling the sequence.

An incremental optical encoder has been proposed in U.S. Pat. No. 3,400,275 which has a light source that is movable with respect to a projection means which projects light from the light source towards a disc, for adjusting the ratio of light intensities or the collimation of the light. However, this proposal has the disadvantages that the rigidity of mounting of the light source is compromised and the manufacture of the movable light source does not lend itself to easy automation, thus leading to increased expense.

SUMMARY OF THE INVENTION

According to the invention, there is provided an incremental optical encoder for a rotating shaft comprising an encoder disc disposed on said shaft having at least one window, a fixed radiation source disposed on one side of said disc and a sensor disposed on the other side of said disc for receiving the radiation from the source and means for regulating the intensity of radiation received by said sensor.

In a preferred embodiment of the invention, the regulating means comprises a wire which is introduced into the light path to compensate the duty cycle and which can be positioned independently of the light source, which remains fixed.

DESCRIPTION OF THE DRAWINGS

Other characteristics of this invention will be clarified by the detailed description of an embodiment the of the invention and will to the accompanying reference drawings of which

DETAILED DESCRIPTION OF THE PREFERRED EMBODIMENT

Figure 1:
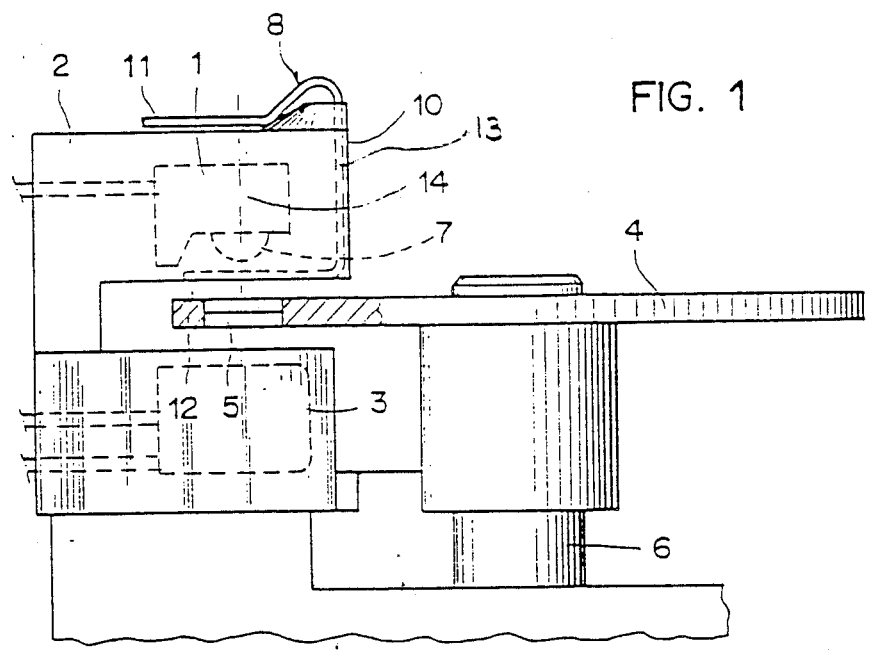
FIG. 1, is an elevated view of the embodiment of the invention.

An embodiment of the incremental optical encoder of the invention will now be described, with reference to the above figures and comprises:

A luminous source 1 having an electroluminescent diode equipped with a lens 7, a holder 2 for the luminous source on which the source is fixed, a sensor 3, consisting of four sensitive zones formed by photosensitive elements 9, at angular positions of 0°, 90°, 180° and 270°, an encoder disk 4 having windows 5, the disk being fixed on a shaft 6 and means 8 for regulating the distribution of the luminous intensity on the sensitive zones (photo-sensitive elements) 9.

Figure 2:
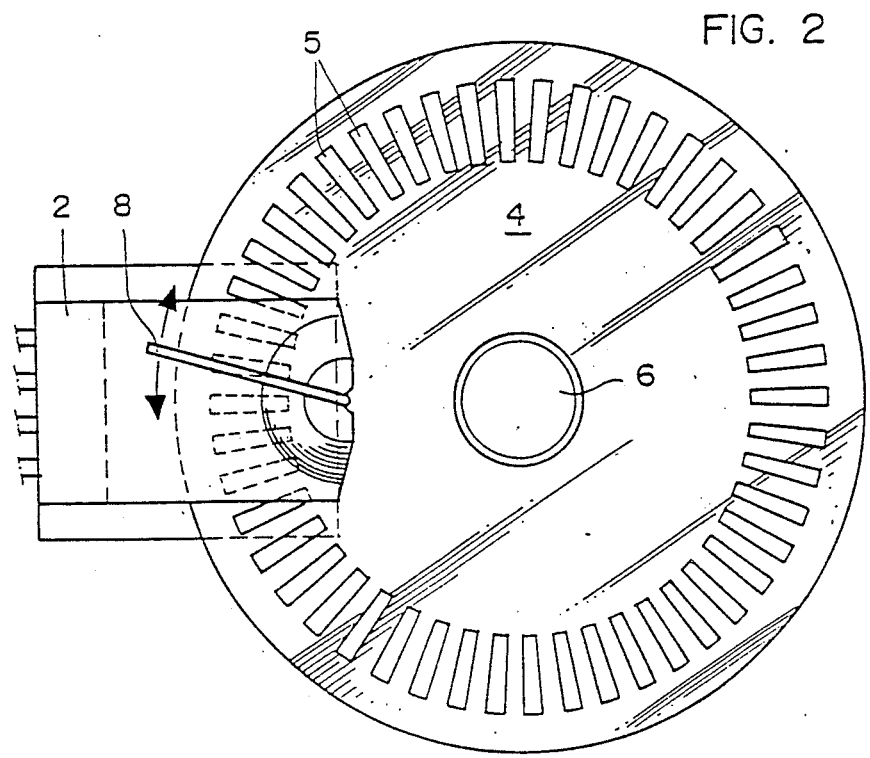
FIG. 2, is a view from above FIG. 1.

The regulation means comprises a wire 8, generally of a U-form of which the base 10 forms an axis of rotation, allowing a branch 12 to swivel by manual action of an opposed branch 11 in the directions indicated by the arrows in FIG. 2. The base 10 can be seated in the guiding slot 13, in order to facilitate operation. The wire 8 is of opaque material and has dimensions such that the branch 12, which is placed between the luminous source and the photosensitive elements 9 will project a shadow on one of more of the elements thereby allowing a fine modulation of the intensity of the light on these elements.

Figure 3:
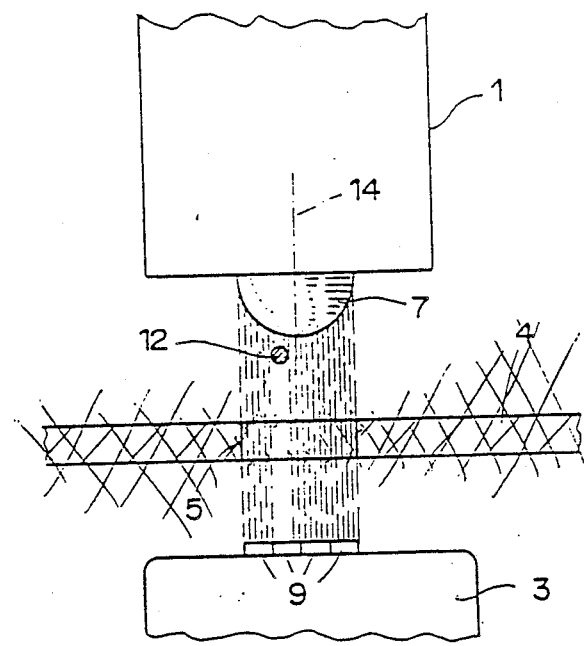
FIG. 3, is an elevated enlarged view from the side of both FIG. 1 and FIG. 2.

In FIG. 3, this effect can be seen more precisely. It is to be noted that the luminous radiation from the luminous source 14 is a pinpoint and even though it is designed to propagate itself parallel to the axis 14 of the lens, can very well in practice diverge. The branch 12 of wire 8 will intercept a part of the luminous radiation and consequently project a shadow on one or more of the elements 9.

Preferably, the regulation means 8 comprises a steel spring, fine enough to intercept only a fraction of the light destined for the sensors, which allows a fine modulation of the intensity of the light on the elements 9. Of course other materials or form could be just as suitable for the regulation means 8.

Tests have been carried out with the help of commercially available elements comprising an LED and a sensor of four photosensitive elements. For normal use according to the instructions of the manufacturer, a duty cycle of the elements may be less than 50% (a duty cycle is the relation between the time during which the signal from the sensor of the channel is on level 1 and the period of the signal). This occurrence is an intrinsic inconvenience and provokes an error of the phase between the two channels, concerning the direction of rotation.

If the light on one of the photosensitive elements is reduced, this provokes a change of its level as compared to the level of the complementary element. Thus, using the regulation means as described above, the duty cycle of one complementary element relative to the other may be changed by reducing the light in the direct line of the LED on the two photosensitive elements in the centre of the sensor. This way the duty cycles can be matched. The wire 8 is therefore positioned in such a way that it can intercept the radiation in the direct line of the LED. Nevertheless, the wire 8 can be pivoted, according to each system's own characteristics, so that the intensity of the light on the photosensitive elements can be regulated in an optimal way, in order to obtain the desired duty cycles of the signals. Regulation may be carried out and controlled with the help of an oscilloscope, with the wire 8 being fixed in position with the help of a drop of glue, for example.

I claim:

1. An incremental optical encoder for a rotating shaft comprising an encoder disc disposed on said shaft having at least one window, a fixed source of radiation disposed on one side of said disc and a sensor disposed on the other side of said disc for receiving the radiation from the source, said sensor consisting of two or more sensitive zones, and regulating means for changing the distribution of the intensity of radiation received on the sensitive zones, the regulating means comprising a movable elongate opaque element arranged to intercept a part of the radiation between the fixed source and the sensor.

2. An incremental optical encoder as claimed in claim 1, in which said regulating means is comprised of metal wire.

3. An incremental optical encoder as claimed in claim 1, in which said radiation source comprises an LED.

4. An incremental optical encoder as claimed in claim 1, in which said element is U shaped having a connecting limb defining an axis of rotation substantially parallel to a rotational axis of said shaft, a first limb comprising the elongate opaque element and a second limb for enabling the position of the first opaque element to be varied by moving the second limb.

5. An incremental optical encoder as claimed in claim 4, in which said opaque element is disposed between said radiation source and said disc.

6. An incremental optical encoder as claimed in claim 1, in which said sensor comprises four sensitive zones respectively arranged at angular positions 0°, 90°, 180°, and 270°.

* * * * *

UNITED STATES PATENT AND TRADEMARK OFFICE
CERTIFICATE OF CORRECTION

PATENT NO. : 4,982,085
DATED : January 1, 1991
INVENTOR(S) : Marc HEYRAUD

It is certified that error appears in the above-identified patent and that said Letters Patent is hereby corrected as shown below:

On the title page, left column at [73], change "La Chaux de Fonds, La Chaus de Fonds, Switzerland" to the correct assignee of --Johnson Electric S A, La Chaux de Fonds, Switzerland--.

Signed and Sealed this

Thirty-first Day of May, 1994

*Attest:*

BRUCE LEHMAN

*Attesting Officer*     *Commissioner of Patents and Trademarks*